(12) United States Patent
Cao et al.

(10) Patent No.: US 10,571,763 B2
(45) Date of Patent: Feb. 25, 2020

(54) ARRAY SUBSTRATE AND ELECTRONIC DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yu Cao, Beijing (CN); Haisheng Zhao, Beijing (CN); Zhaohu Wen, Beijing (CN); Cong Lin, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/741,675

(22) PCT Filed: Jun. 29, 2017

(86) PCT No.: PCT/CN2017/090758
§ 371 (c)(1),
(2) Date: Jan. 3, 2018

(87) PCT Pub. No.: WO2018/024054
PCT Pub. Date: Feb. 8, 2018

(65) Prior Publication Data
US 2019/0155112 A1 May 23, 2019

(30) Foreign Application Priority Data
Aug. 1, 2016 (CN) .......................... 2016 1 0622111

(51) Int. Cl.
*H01L 27/14* (2006.01)
*G02F 1/1362* (2006.01)
(Continued)

(52) U.S. Cl.
CPC .. *G02F 1/136204* (2013.01); *G02F 1/136259* (2013.01); *G02F 1/136286* (2013.01);
(Continued)

(58) Field of Classification Search
CPC ... H01L 27/12; H01L 21/84; G02F 1/136204; G02F 1/136259
See application file for complete search history.

(56) References Cited

U.S. PATENT DOCUMENTS 6,605,495 B1  8/2003  Kuo
9,678,372 B2  6/2017  Fu
(Continued)

OTHER PUBLICATIONS

1st Office Action dated Aug. 3, 2018 in CN201610622111.5.
International Search Report and Written Opinion dated Oct. 11, 2017 in PCT/CN2017/090758.

*Primary Examiner* — Phuc T Dang
(74) *Attorney, Agent, or Firm* — Syncoda LLC; Feng Ma

(57) ABSTRACT

An array substrate is disclosed herein, which includes a substrate, a plurality of signal lines, and conductive layer. The plurality of signal lines are disposed over the substrate, and have at least two signal lines insulated and staggered from one another to thereby form at least one signal line-staggered region at each site of staggering. It is configured such that a first zone formed by an orthographic projection of the at least one signal line-staggered region on the substrate is configured to have a gap with a second zone formed by an orthographic projection of the conductive layer on the substrate excluding the first zone. The array substrate can be a thin-film transistor array substrate, where the plurality of signal lines can include a common signal line and a plurality of gate lines, and the common signal line can be staggered with each gate line at a signal line-staggered region.

18 Claims, 9 Drawing Sheets

(51) Int. Cl.
*H01L 27/12* (2006.01)
*G02F 1/1368* (2006.01)

(52) U.S. Cl.
CPC .......... *H01L 27/124* (2013.01); *G02F 1/1368* (2013.01); *G02F 2001/136263* (2013.01)

(56) References Cited

U.S. PATENT DOCUMENTS

2016/0351719 A1* 12/2016 Shih .................. H01L 29/78606
2017/0115768 A1* 4/2017 Shih ........................ G06F 3/044
2017/0277307 A1* 9/2017 Xu ........................... G06F 3/044

* cited by examiner

ARRAY SUBSTRATE AND ELECTRONIC DEVICE

CROSS-REFERENCE TO RELATED APPLICATION

The present application claims priority to Chinese Patent Application No. 201610622111.5 filed on Aug. 1, 2016, the disclosure of which is hereby incorporated by reference in its entirety.

TECHNICAL FIELD

The present disclosure is related generally to the field of electronic devices, and more specifically to an array substrate, a manufacturing method thereof, and an electronic device.

BACKGROUND

Static electricity is frequently produced during the manufacturing process of thin-film transistor array substrates. It has been found that most electrostatic breakdown occurs at a signal line-staggered region in a surrounding area of an array substrate where jumpers, or a conductive layer having a functionality of jumpers, are located.

The jumpers or the conductive layer as mentioned above are usually made of transparent conductive layers, and are typically laid on the entire array substrate to electrically connect electrode lines and signal lines. In an illustrating example as shown in FIG. 1, a conductive layer 1' is configured to electrically connect common electrode lines 10 and common signal lines 20 to thereby allow signals to be transmitted from the signal lines to the electrode lines.

If an electrostatic breakdown occurs at a site where test lines, short-circuit rings, or repair lines are located, the short-circuiting sites can by repaired via a process comprising laser cutting and a subsequent repair. However, if the electrostatic breakdown happens at a signal line-staggered region, upon laser cutting, the conductive layer 1' is easily welded with the signal lines. Because the entire surface of the conductive layer 1' is laid on the whole array substrate, the short-circuiting sites cannot be completely disconnected to allow a subsequent repair.

SUMMARY

The present disclosure provides an array substrate, a manufacturing method thereof, and an electronic device, aiming at addressing the above mentioned issue associated with existing technologies, i.e., when an electrostatic breakdown happens at a signal line-staggered region, the short-circuiting sites cannot be repaired by laser cutting due to the easy welding between the conductive layer and the signal lines.

In a first aspect, an array substrate is disclosed herein. The array substrate includes a substrate, a plurality of signal lines, and conductive layer.

The plurality of signal lines are disposed over the substrate, and have at least two signal lines insulated and staggered from one another to thereby form at least one signal line-staggered region at each site of staggering. It is configured such that a first zone formed by an orthographic projection of the at least one signal line-staggered region on the substrate is configured to have a gap with a second zone formed by an orthographic projection of the conductive layer on the substrate excluding the first zone.

Herein the array substrate can be a thin-film transistor array substrate, and accordingly the plurality of signal lines can include a common signal line and a plurality of gate lines. The common signal line is staggered with each gate line at a signal line-staggered region.

According to some embodiments, the conductive layer is provided with at least one unfilled region, and an orthographic projection of each of the at least one signal line-staggered region on the substrate is configured to be completely covered by an orthographic projection of one of the at least one unfilled region on the substrate.

Herein an unfilled region of the conductive layer is referred to as an opening or an aperture in the conductive layer that contains no conductive layer material therein, and the unfilled region of the conductive layer can take a shape such as an unfilled groove or an enclosed opening, and can take other shapes as well.

In some of the above-mentioned embodiments of the array substrate, the unfilled region can be an unfilled groove that separates different portions of the conductive layer. As such, the conductive layer can include a plurality of first portions, which are disposed in a non-display area and are separated from one another.

The plurality of first portions are configured such that every two neighboring first portions are separated from one another by one of the at least one unfilled region (i.e. one groove), and an orthographic projection of the one of the at least one unfilled region on the substrate is configured to cover an orthographic projection of one of the at least one signal line-staggered region on the substrate.

The conductive layer can further include a second portion, disposed in a display area. The second portion is separated from each of the plurality of first portions and is electrically coupled with a common electrode line.

In some others of the above-mentioned embodiments of the array substrate, the unfilled region can be an enclosed opening that is surrounded by the conductive layer, i.e., each opening has a closed edge with the conductive layer.

As such, in the array substrate, one or more of the at least one unfilled region can be in a non-display area, and each of the one or more of the at least one unfilled region is surrounded by the conductive layer and is configured such that an orthographic projection thereof on the substrate is configured to cover an orthographic projection of one of the at least one signal line-staggered region on the substrate.

The conductive layer can further include at least one third portion. Each of the at least one third portion is disposed within, and isolated from other part of the conductive layer by, one of the at least one unfilled region as described above. It can be configured such that an orthographic projection of each of the at least one third portion on the substrate is overlapped with an orthographic projection of one of the at least one signal line-staggered region on the substrate.

The array substrate can further include a plurality of common electrode lines, and the conductive layer is configured to electrically couple the common signal line with each of the plurality of common electrode lines.

According to some embodiments, the array substrate further includes a first insulating layer, disposed between the plurality of common electrode lines and the conductive layer. The conductive layer is electrically coupled with each of the plurality of common electrode lines by means of a plurality of vias across the first insulating layer.

Herein the plurality of vias can include at least one first via and at least one third via, and the conductive layer is electrically coupled with the each common electrode line by means of the at least one first via in a display area, and by means of the at least one third via in a non-display area.

According to some other embodiments, the array substrate further includes a second insulating layer, which is disposed between the common signal line and the plurality of common electrode lines. The conductive layer is electrically coupled with the common signal line through at least one second via across the first insulating layer and the second insulating layer.

In the above mentioned array substrate, the plurality of common electrode lines can be disposed in a same layer as, and are each in parallel with, the plurality of gate lines.

According to some embodiments, the array substrate further includes a plurality of data lines, which are disposed in a same layer as, and are each in parallel with, the common signal line.

In any of the embodiments of the array substrate as described above, the conductive layer comprises a transparent conductive material, which can be at least one of HIZO, ZnO, TiO2, CdSnO, MgZnO, IGO, IZO, ITO, and IGZO.

In a second aspect, the present disclosure further provides an electronic device, which includes an array substrate according to any one of the embodiments as described above.

The electronic device can be a display device which includes a display panel, and the array substrate can be in the display panel.

In a third aspect, the present disclosure further provides a method for manufacturing the array substrate as described above. The method comprises the following steps:

Providing a substrate;

Forming a plurality of signal lines over the substrate, wherein the plurality of signal lines have at least two signal lines insulated and staggered from one another to thereby form at least one signal line-staggered region at each site of staggering; and Forming a conductive layer over the plurality of signal lines, wherein the conductive layer is configured such that a first zone formed by an orthographic projection of the at least one signal line-staggered region on the substrate has a gap with a second zone formed by an orthographic projection of the conductive layer on the substrate excluding the first zone.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiment. For those of ordinary skill in the art, other drawings of other embodiments can become apparent based on these drawings.

DETAILED DESCRIPTION

Figure 1:
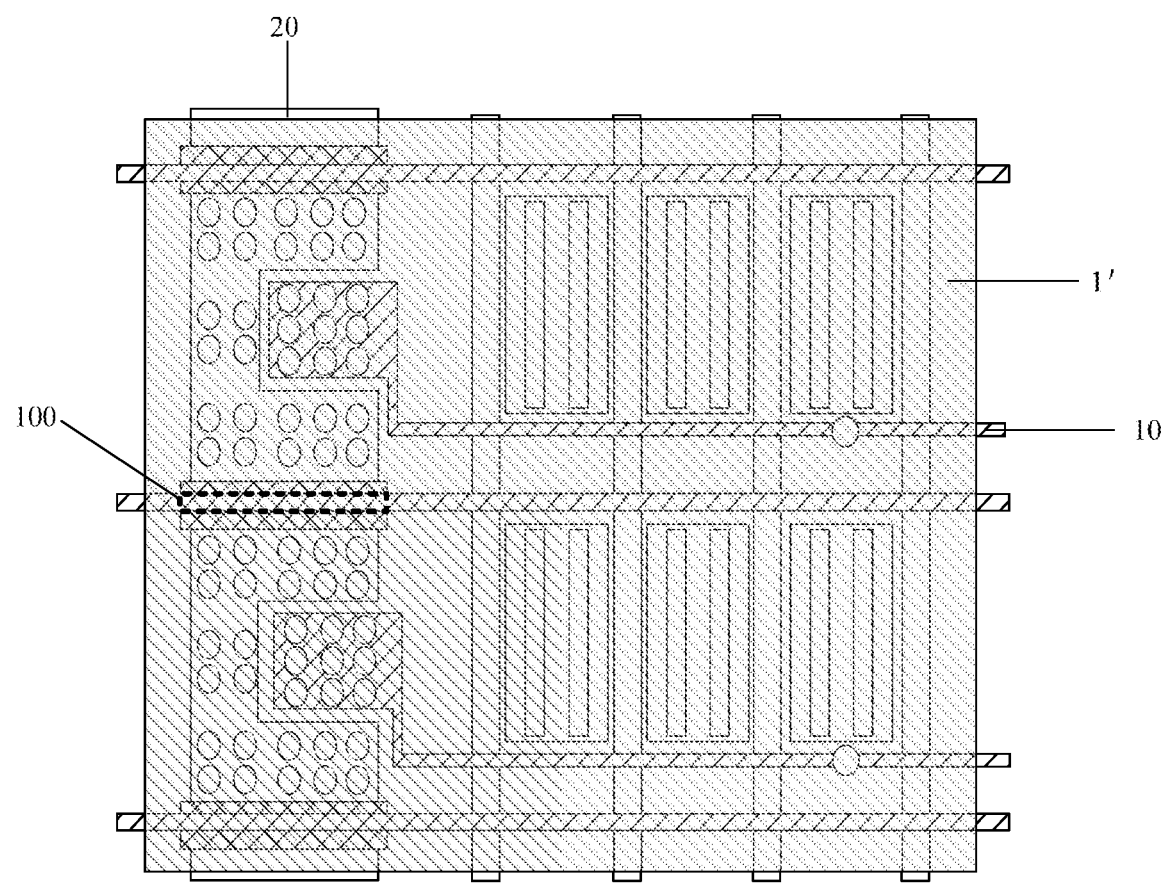
FIG. 1 is a schematic diagram of a conductive layer disposed on an array substrate according to conventional technologies.

In the following, with reference to the drawings of various embodiments disclosed herein, the technical solutions of the embodiments of the disclosure will be described in a clear and fully understandable way.

As mentioned above, static electricity is frequently produced during the manufacturing process of thin-film transistor array substrates, and most electrostatic breakdown occur at a signal line-staggered region in a surrounding area of the array substrate and at where jumpers, or a conductive layer having a functionality of jumpers, are located.

Herein a conductive layer is usually made of a transparent conductive layer, and is typically laid on the entire array substrate to electrically connect electrode lines and signal lines. In a conventional array substrate configured with a conductive layer, if an electrostatic breakdown happens at a signal line-staggered region, because the conductive layer is laid on the whole array substrate, i.e., the conductive layer is disposed at a signal line-staggered region, and a transparent conductive material is easily welded with a metal material, thus upon laser cutting, the conductive layer is easily welded with the signal lines.

As such, the short-circuiting sites on the array substrate having a conventional conductive layer cannot be completely disconnected to thereby allow a subsequent repair.

In order to address the technical issues as described above, the present disclosure provides an array substrate. The array substrate includes a substrate, a plurality of signal lines, and conductive layer.

The plurality of signal lines are disposed over the substrate, and have at least two signal lines insulated and staggered from one another to thereby form at least one signal line-staggered region at each site of staggering. It is configured such that a first zone formed by an orthographic projection of the at least one signal line-staggered region on the substrate is configured to have a gap with a second zone formed by an orthographic projection of the conductive layer on the substrate excluding the first zone.

Herein the array substrate can be a thin-film transistor array substrate, and accordingly the plurality of signal lines can include a common signal line and a plurality of gate lines. The common signal line is staggered with each gate line at a signal line-staggered region.

According to some embodiments, the conductive layer is provided with at least one unfilled region, and an orthographic projection of each of the at least one signal line-staggered region on the substrate is configured to be completely covered by an orthographic projection of one of the at least one unfilled region on the substrate.

Herein an unfilled region of the conductive layer is referred to as an opening or an aperture in the conductive layer that contains no conductive layer material therein, and the unfilled region of the conductive layer can take a shape such as an unfilled groove or an enclosed opening.

In some of the above-mentioned embodiments of the array substrate, the unfilled region can be an unfilled groove that separates different portions of the conductive layer.

As such, the conductive layer can include a plurality of first portions, which are disposed in a non-display area and are separated from one another. The plurality of first portions are configured such that every two neighboring first portions are separated from one another by one of the at least one unfilled region (i.e. one groove), and an orthographic projection of the one of the at least one unfilled region on the substrate is configured to cover an orthographic projection of one of the at least one signal line-staggered region on the substrate. As such, the conductive layer can further include a second portion, disposed in a display area. The second portion is separated from each of the plurality of first portions and is electrically coupled with a common electrode line. These embodiments herein will be illustrated in FIG. 3, and will be described in detail in the following disclosure.

In some others of the above-mentioned embodiments of the array substrate, the unfilled region can be an enclosed opening that is surrounded by the conductive layer, i.e., each opening has a closed edge with the conductive layer.

As such, in the array substrate, one or more of the at least one unfilled region can be in a non-display area, and each of the one or more of the at least one unfilled region is surrounded by the conductive layer and is configured such that an orthographic projection thereof on the substrate is configured to cover an orthographic projection of one of the at least one signal line-staggered region on the substrate. These embodiments herein will be illustrated in FIG. 6 and FIG. 7, and will be described in detail in the following disclosure.

In the aforementioned embodiments of the array substrate, the conductive layer can further include at least one third portion. Each of the at least one third portion is disposed within, and isolated from other part of the conductive layer by, one of the at least one unfilled region as described above. It can be configured such that an orthographic projection of each of the at least one third portion on the substrate is overlapped with an orthographic projection of one of the at least one signal line-staggered region on the substrate. These embodiments herein will be illustrated in FIGS. 8-10, and will be described in detail in the following part of the disclosure.

Because the regions of the conductive layer that are arranged outside, or in a periphery of, each unfilled region of the conductive layer are configured to electrically connect an electrode line with a corresponding signal line to thereby serve the function as jumpers, each of the unfilled region in the conductive layer substantially forms a partitioning zone for a corresponding signal line-staggered region (i.e. the signal line-staggered region whose orthographic projection on the substrate is located with an orthographic projection of the unfilled region on the substrate). As such, the partitioning zone substantially serves to partition, or to separate, the region corresponding to the signal line-staggered region from other regions of the conductive layer in the array substrate.

As such, if an electrostatic breakdown occurs at the signal line-staggered region, this above configuration allows laser cutting and a subsequent repair by means of the partitioning zone. Because a conductive layer material is not disposed in the partitioning zone, the issue of easy welding between the conductive layer and signal lines in conventional array substrates can be effectively overcome, leading to an improved repair rate.

In the following, a detailed description of the array substrate as mentioned above is provided through several specific embodiments. It is noted that these embodiments do not limit the scope of the present disclosure.

Figure 2:
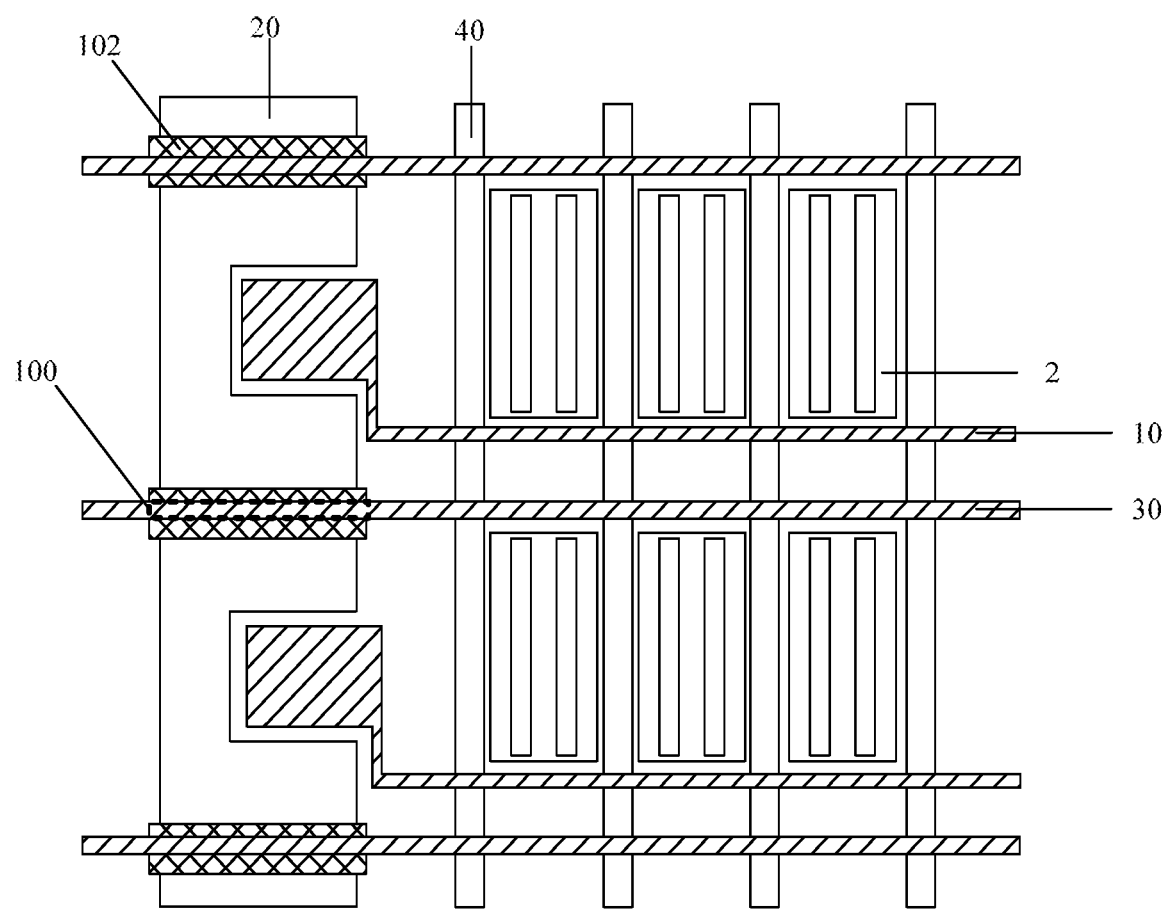
FIG. 2 is a schematic diagram of an array substrate according to some embodiments of the present disclosure where a conductive layer is not shown.
Figure 3:
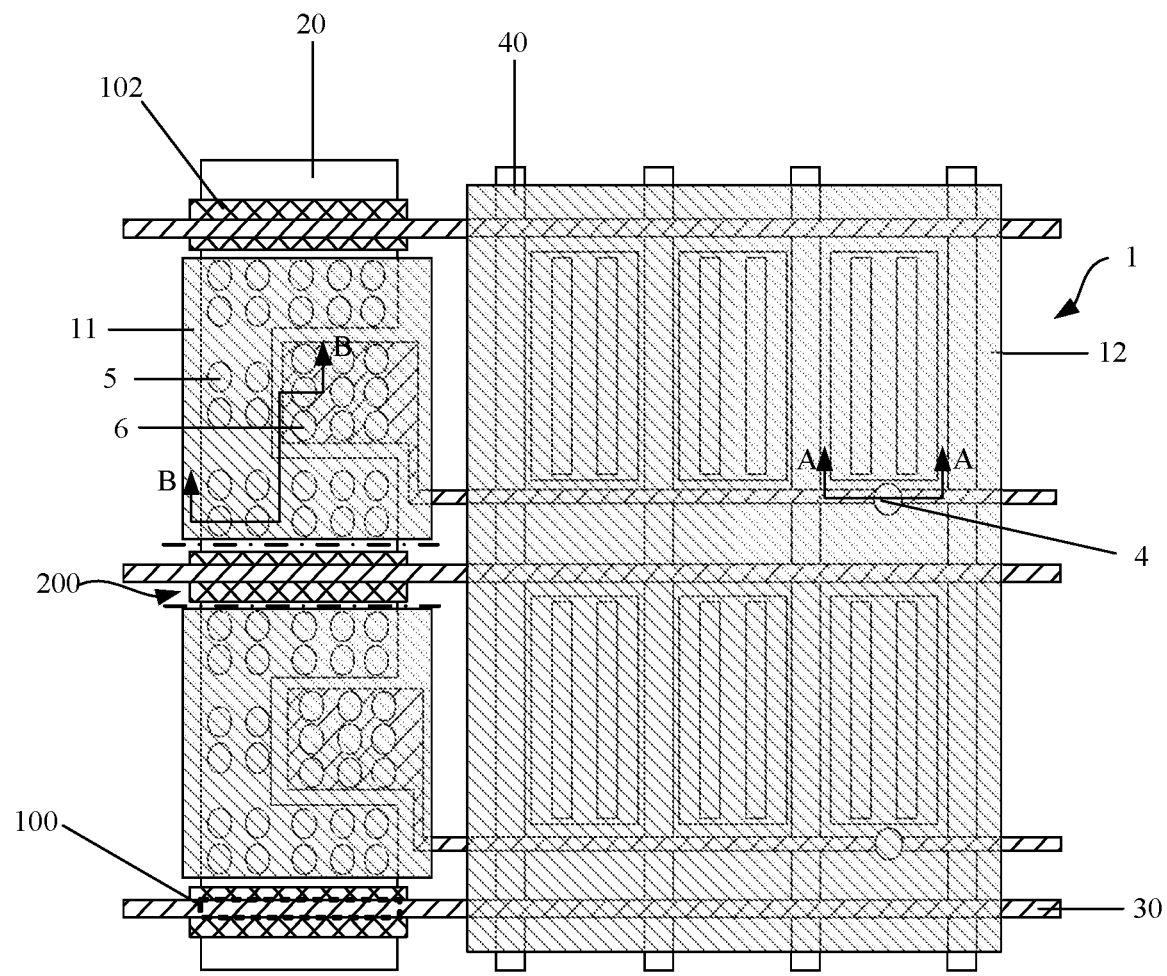
FIG. 3 is a schematic diagram of a conductive layer in an array substrate according to a first embodiment of the present disclosure.

FIG. 2 and FIG. 3 illustrate an array substrate according to a first embodiment of the present disclosure, where the array substrate is a thin-film transistor array substrate. As shown in FIG. 2 and FIG. 3, the array substrate comprises at least two signal lines, insulated from one another. The at least two signal lines are configured to be staggered to thereby form at least one signal line-staggered region 100 at a site of staggering. An insulating layer is typically disposed between the at least two signal lines at a different layer to thereby provide insulation between the at least two signal lines.

The array substrate comprises a first area, and the at least two signal lines include a first signal line 20 in the first area. The array substrate further comprises an electrode line 10 and a conductive layer 1. The conductive layer 1 is configured to electrically connect the electrode line 10 and the first signal line 20. Herein the first area can be a non-display area of the array substrate.

In the conductive layer, a partitioning zone 200 is arranged in a periphery of a region corresponding to one signal line-staggered region 100 (i.e. the region formed by the orthographic projection of the signal line-staggered region on the conductive layer), and is configured to partition the one signal line-staggered region 100 from other regions in the conductive layer of the array substrate.

In the first embodiment of the array substrate as described above, a partitioning zone is arranged in a periphery of each of regions corresponding to the at least one signal line-staggered region for partitioning, and regions of the conductive layer outside the partitioning zone can be configured to electrically connect an electrode line with a corresponding signal line. As such, if an electrostatic breakdown occurs at one signal line-staggered region, the above configuration allows laser cutting and a subsequent repair at a corresponding partitioning zone (i.e., the partitioning zone corresponding to the one signal line-staggered region).

As such, the issue of easy welding between the conductive layer and the signal lines in conventional substrates can thus be effectively solved, which can lead to an improved repair rate for the electronic products having the array substrate.

The following are a variety of manners in which the at least one opening is arranged in the conductive layer.

In the first embodiment as illustrated in FIG. 2 and FIG. 3, the conductive layer 1 is configured to comprise a plurality of first portions 11. The plurality of first portions are all arranged in the first area of the array substrate. Every two neighboring first portions 11 are separated from one another with a gap (i.e. specifically as an unfilled region shaped as a groove), and are configured such that an orthographic projection of the gap on the substrate fully covers an orthographic projection of one signal line-staggered region 100 on the substrate. Thus each gap between the every two neighboring first portions 11 substantially form an unfilled partitioning zone of one of the at least one opening in the conductive layer.

Because there is no conductive layer material disposed in any region corresponding to the signal line-staggered region 100 or in any partitioning zone 200, if an electrostatic breakdown occurs at one signal line-staggered region 100, the corresponding partitioning zone 200 (e.g., the region enclosed with a dashed line as illustrated in FIG. 3) can be utilized to allow laser cutting and a subsequent repair. As such, the issues of easy welding between a conductive layer and signal lines in conventional array substrates can be effectively solved, which leads to an improved repair rate for the products.

The array substrate further comprises a second area, which is configured not to overlap with the first area and thus does not include any signal line-staggered region 100. Accordingly, the conductive layer 1 can comprise a second portion 12, which is configured to cover the entire second area. Herein the first area can be a display area of the array substrate.

The conductive layer 1 can comprise a transparent conductive material such as HIZO, ZnO, TiO2, CdSnO, MgZnO, IGO, IZO, ITO, and IGZO.

It should be noted that the technical solution as disclosed herein can be employed in all electrical boards that have conductive layers and signal line-staggered regions, besides the array substrates that haven been described above.

In the following, a thin-film transistor array substrate is used as an example to illustrate the technical solution as disclosed herein.

In the thin-film transistor array substrate, the first area and the second area as mentioned above respectively represent a non-display area and a display area. The electrode lines 10 as mentioned above represent common electrode lines 10; and the first signal lines 20 as mentioned above represent common signal lines 20.

As such, in the thin-film transistor array substrate, the conductive layer 1 is configured to electrically connect common electrode lines 10 and common signal lines 20. Each common signal line 20 is configured to transmit a common signal to a corresponding common electrode line 10, and each common electrode line 10 is configured to provide a reference voltage to the display area.

If the thin-film transistor array substrate also comprises common electrodes 2, each common electrode line 10 is electrically connected with, and configured to transmit the reference voltage to, the common electrodes 2. A common electrode 2 and a corresponding pixel electrode (not shown in the drawings) together form a transverse driving electric field. Each common electrode line 10 can be electrically connected with a common electrode 2 through vias in an insulating layer disposed in between the common electrode lines 10 and the common electrodes 2 (not shown in the drawings).

It should be noted that the electrode lines 10 and the first signal lines 20 as mentioned above are not limited to being common electrode lines and common signal lines, but can also be other combinations. There are no limitations herein.

In the thin-film transistor array substrate as mentioned above, part of a common signal line 20 can be located in a signal line-staggered region 100, the configuration as described above can allow cutting on the two sides of the signal line-staggered region 100, as illustrated by the dashed line in FIG. 3, which substantially disconnects the common signal line 20, allowing for a subsequent repair without affecting the signal transmission on other signal lines (e.g., the signal line 30 as shown in FIG. 3).

If the common signal line 20 is disconnected at the two sides of the signal line-staggered region 100 for subsequent repair, the cutting off of the common signal line 20 within the signal line-staggered region 100 can consequently affect the signal transmission, rendering some of the common electrode lines 10 unable to receive the signal from the common signal line 20.

In order to solve the issue as mentioned above, it can be configured such that the conductive layer 1 further comprises a second portion 12, which covers the display area of the array substrate, and the second portion 12 of the conductive layer 1 is configured to electrically connect a portion of the common electrode line 10.

By such a configuration as mentioned above, although a portion of the common electrode line 10 is disconnected with the common signal line 20 due to the cutting off of the common signal line 20, by means of the second portion 12, the signal can still be transmitted to the portion of the common electrode line 10 disconnected to the common signal line 20, and as such, all common electrode lines 10 can normally receive the signal from the common signal line 20.

It can be configured that the second portion 12 and each of the plurality of first portions 11 neighboring to the second portion 12 are separated from one another with a distance.

The thin-film transistor array substrate also includes gate lines 30 and data lines 40, which are arranged to define a plurality of pixel regions. Each pixel region includes a thin-film transistor and a pixel electrode (not shown in the drawings).

Herein, the thin-film transistors can be a silicon semiconductor thin film transistor, or a metal oxide thin film transistor. In each thin-film transistor, a gate electrode is electrically connected with a gate line 30, a source electrode is electrically connected with a data line 40, and a drain electrode is electrically connected with a pixel electrode (not shown in the drawings). By transmitting a gate scan signal to the gate line 30, the thin-film transistors on the array substrate can be opened row by row, and then by transmitting a pixel voltage to the pixel electrode through the thin-film transistor, a driving electric field can be formed to thereby control the display process.

Specifically, the common electrode lines 10 and the gate lines 30 can be arranged in a same layer as, and in parallel with, each other, which can be manufactured by one-time patterning over a same gate metal layer. The common signal lines 20 and the data lines 40 can be arranged in a same layer as, and in parallel with, each other, which can be manufactured by one-time patterning over a same source-drain metal layer.

The gate lines 30 and the common signal lines 20 are configured such that an orthographic projection of the gate lines 30 on the substrate overlaps with an orthographic projection of the common signal lines 20 on the substrate, to thereby form the signal line-staggered regions 100.

A passivation layer can be arranged between the gate lines 30 and the common signal lines 20 to thereby realize an insulation between the gate lines 30 and the common signal lines 20.

The gate metal layer and the source-drain metal layer as described above can have a composition of a metal such as Cu, Al, Ag, Mo, Cr, Nd, Ni, Mn, Ti, Ta, and W, or an alloy having a combination of the metals as mentioned above. The gate metal layer and the source-drain metal layer can be of a single-layer structure or of a multiple-layer structure (e.g. Cu\Mo, Ti\Cu\Ti, or Mo\Al\Mo).

A first insulating layer 101 can be arranged between the conductive layer 1 and the common electrode lines 10. The first insulating layer 101 is provided with at least one first via 4, through which a portion of the electrode line (or the common electrode line 10) is electrically connected to the second portion 12 of the conductive layer 1. As such, even though an electrostatic breakdown occurs in a signal line-staggered region 100 and the signal-line staggered region 100 undergoes laser cutting and a subsequent repair, through the at least one first via 4, the signal from the common signal lines 20 can still be received by all common electrode lines 10.

Figure 5:
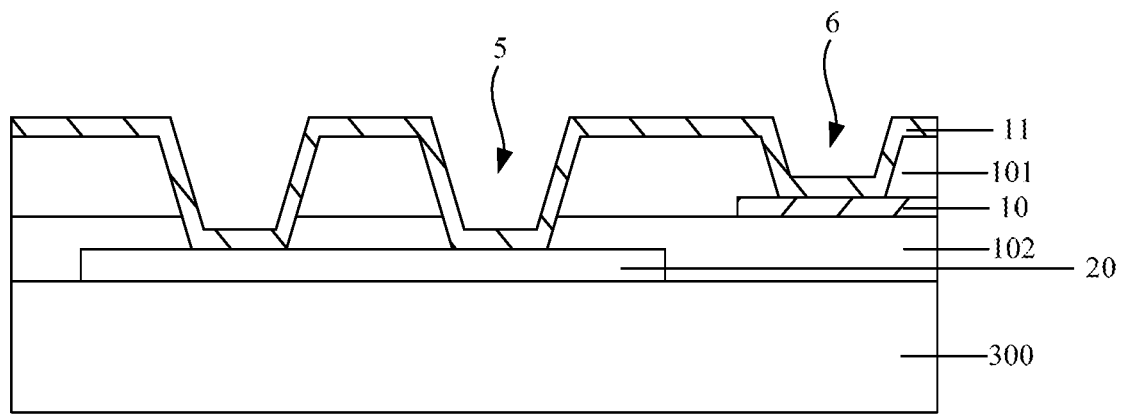
FIG. 5 is a cross-section view of the array substrate as shown in FIG. 3 along a direction of B-B.

Specifically, if the common signal lines 20 are below the common electrode lines 10, and a second insulating layer 102 is disposed between the common electrode lines 10 and the common signal lines 20, each of the first portions 11 of the conductive layer 1 is electrically connected to the common signal lines 20 through at least one second via 5 across both the first insulating layer 101 and the second insulating layer 102, and the first portion 11 of the conductive layer 1 is electrically connected to the common electrode lines 10 through at least one third via 6 across the first insulating layer 101. Such a configuration allows the common signal lines 20 to electrically connect the common electrode lines 10, as shown in FIG. 5.

As shown by the illustrating thin-film transistor array substrate in FIGS. 2-5, the array substrate according to some embodiments of the present disclosure comprises a plurality of gate lines 30 and a plurality of data lines 40, disposed over a transparent substrate 300 (which can be a quartz substrate or a glass substrate), and configured to define a plurality of pixel regions.

Each pixel region comprises a thin-film transistor, a pixel electrode, and a common electrode 2. A gate electrode of the thin-film transistor is electrically connected with a gate line 30, a source electrode of the thin-film transistor is electrically connected with a data line 40, and a drain electrode of the thin-film transistor is electrically connected with the pixel electrode.

The array substrate further comprises a plurality of common electrode lines 10, which are disposed in a same layer as, and in parallel with, the plurality of gate lines 30, and are configured to electrically connect with the common electrodes 2.

The array substrate further comprises a plurality of common signal lines 20, which are disposed in a same layer as, and in parallel with, the plurality of data lines 40, and are configured to electrically connect with the plurality of common electrode lines 10, and to transmit a reference voltage. An orthographic projection of the plurality of gate lines 30 on the substrate overlaps with an orthographic projection of the plurality of common signal lines 20 on the substrate to thereby form the signal line-staggered regions 100.

The array substrate further comprises a conductive layer 1, which comprises a plurality of first portions 11 and a second portion 12. The plurality of first portions 11 are each disposed in a non-display area, and the second portion 12 is disposed to cover a display area. Every two neighboring first portions 11 are separated from one another with a gap or an unfilled groove, and the gap (or the unfilled grooved) substantially forms one of the at least one unfilled region of the conductive layer.

In the conductive layer of the array substrate, a partitioning zone 200 (i.e., unfilled region) is arranged in a periphery of each region corresponding to each signal line-staggered region 100, configured to partition the signal line-staggered region 100 from other regions of the conductive layer in the array substrate. The second portion 12 and each neighboring first portion 11 are separated from each other with a gap (i.e., unfilled region).

In the array substrate, a first insulating layer 101 is disposed between the conductive layer 1 and the plurality of common electrode lines 10. The first insulating layer 101 is provided with at least one first via 4 and at least one third via 6, and part of a common electrode line 10 is electrically connected with the second portion 12 through the at least one first via 4 (as illustrated in FIG. 3).

In the array substrate, a second insulating layer 102 is disposed between a layer having the plurality of gate lines 30 and the plurality of common electrode lines 10 and a layer having the plurality of common signal lines 20.

Each first portion 11 of the conductive layer 1 is electrically connected to the common signal lines 20 through the at least one second via 5 across the first insulating layer 101 and the second insulating layer 102, and the first portion 11 of the conductive layer 1 is electrically connected to the common electrode lines 10 through the at least one third via 6 across the first insulating layer 101. These two above electrical connections together realize an electrical connection between the common signal lines 20 and the common electrode lines 10.

The array substrate as described above can be applied in any type of the thin-film transistors, such as a top-gate thin-film transistor, a bottom-gate thin-film transistor, or a coplanar thin-film transistor.

The pixel electrodes and the common electrodes 2 can have a composition of a transparent conductive material, and the insulating layers can have a composition of $SiN_x$, $SiO_2$, and SiON.

In practice, adjustment of existing components or addition of new components is possible and can be carried out over the above mentioned thin-film transistor array substrate depending on practical needs. There are also covered in the protecting scope of the present disclosure.

In the first embodiment as described above, there is no conductive layer material arranged in regions corresponding to the signal line-staggered region and the partitioning zones of the conductive layer. As such, if an electrostatic breakdown occurs at the signal line-staggered region, the partitioning zone can be utilized for laser cutting and a subsequent repair, which can overcome the issue that short-circuiting sites cannot be repaired via laser cutting due to the easy welding between the conductive layer and the signal lines.

A second embodiment is provided in the following with a thin-film transistor array substrate also as an illustrating example.

Figure 6:
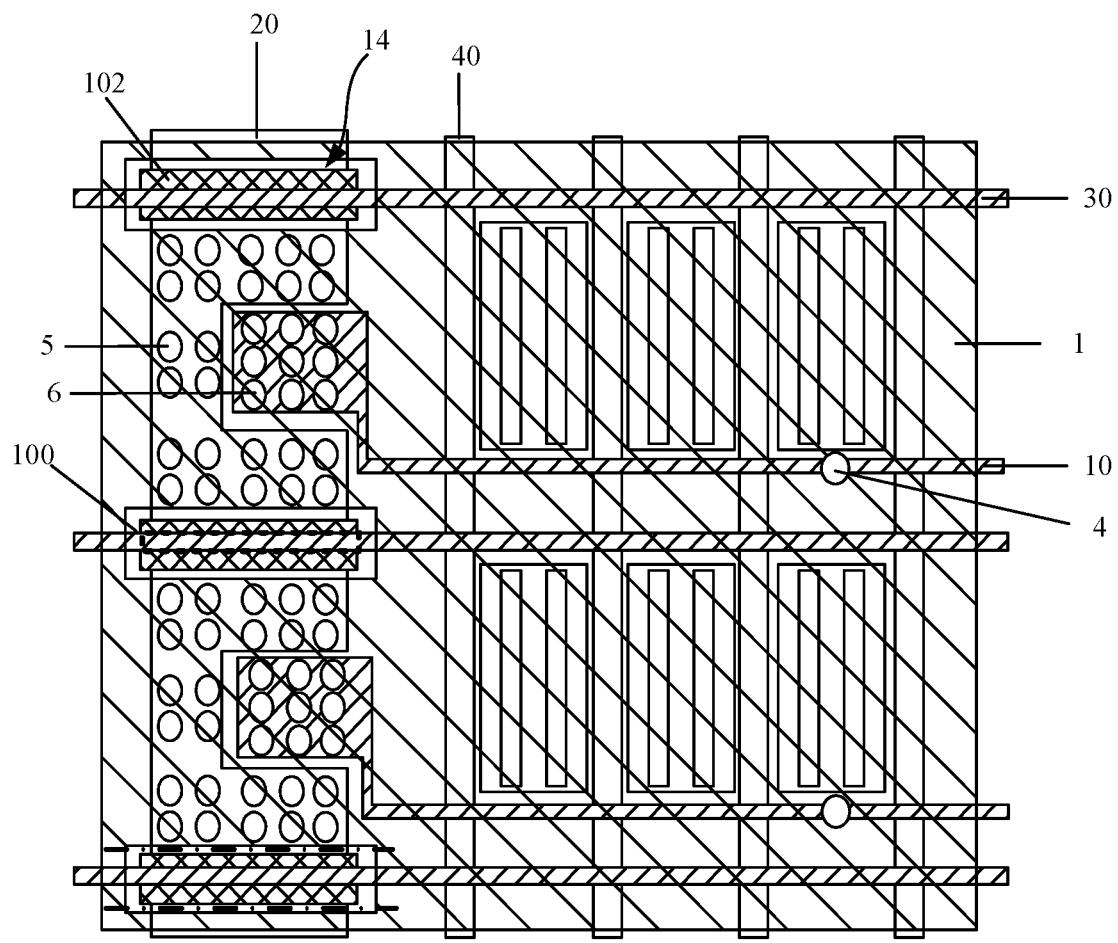
FIG. 6 is a schematic diagram of a conductive layer in an array substrate according to a second embodiment of the present disclosure.
Figure 7:
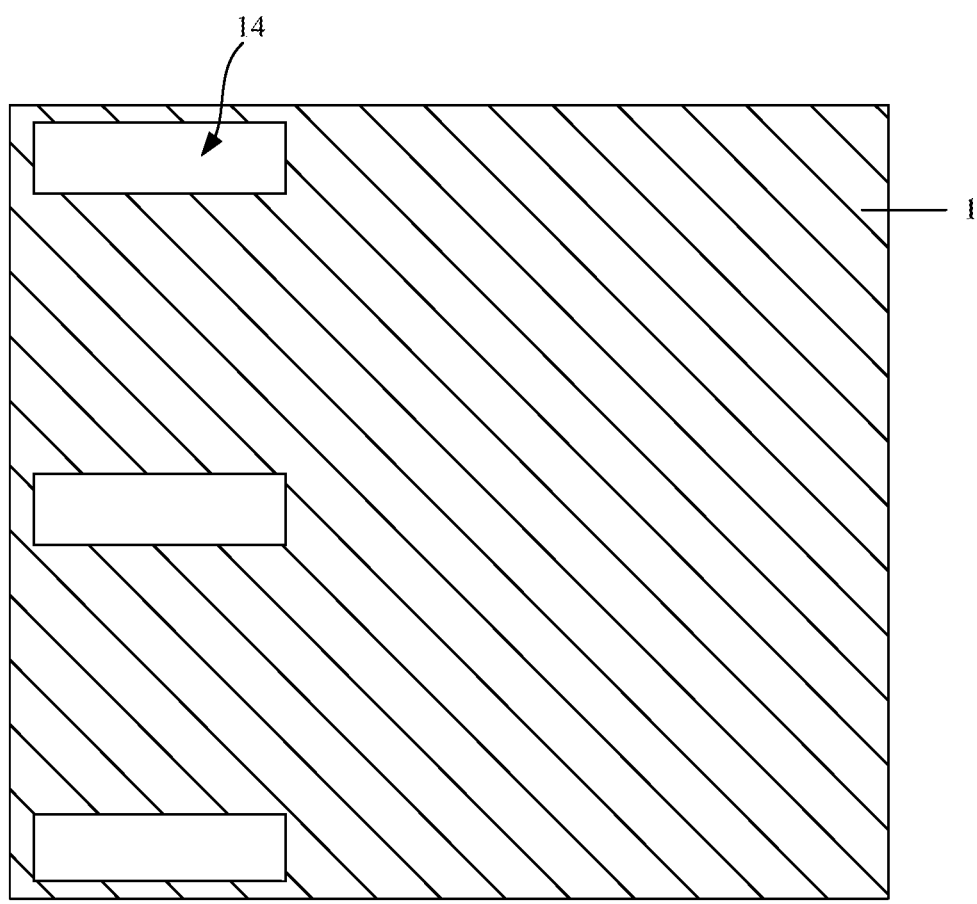
FIG. 7 is a schematic diagram of the conductive layer shown in FIG. 6.

Differing from the first embodiment as described above, a conductive layer 1 having a plurality of openings 14 is configured to cover the entire array substrate in the second embodiment, as illustrated in FIG. 2, FIG. 6, and FIG. 7.

Each signal line-staggered region 100 is arranged in a region of the conductive layer corresponding to one of the plurality of openings 14. The region corresponding to one opening 14 (i.e. an unfilled yet enclosed region) that is in the periphery of the each signal line-staggered region 100 substantially forms a partitioning zone, and no conductive layer material is arranged in the regions corresponding to the each signal line-staggered region or in the partitioning zone.

As such, if an electrostatic breakdown occurs at one signal line-staggered region, the partitioning zone can be utilized for laser cutting and a subsequent repair, which can overcome the issue that due to the easy welding between the conductive layer and the signal lines, the short-circuiting sites cannot be repaired via laser cutting.

A first insulating layer is disposed between the conductive layer 1 and the common electrode lines 10, and is configured such that part of the common electrode line 10 is electrically connected with the conductive layer 1 through at least one second via 4 across the first insulating layer.

The at least one second via 4 is arranged in a display area, and by such a configuration, even upon an electrostatic breakdown, the signal line-staggered region 100 can undergo laser cutting and a subsequent repair without affecting the signal transmission from the common signal line 20 to the common electrode lines 10.

As a variation of the technical solution as described in the second embodiment, the conductive layer can comprise a first portion and a second portion, disposed to cover the non-display area and the display area respectively. The first portion of the conductive layer is provided with a plurality of openings, and each signal line-staggered region can be arranged within a region corresponding to one of the plurality of openings.

It can be further configured such that a portion of each common electrode line 10 is electrically connected with the second portion of the conductive layer 1, as such, even upon an electrostatic breakdown, the signal line-staggered region 100 can undergo laser cutting and a subsequent repair, without affecting the signal transmission from the common signal line to all of the common electrode lines.

To this purpose, the second insulating layer can be provided with at least one second via, through which the conductive layer can be electrically connected to the common electrode lines.

In one array substrate as a specific example, the conductive layer 1 is disposed over, and configured to entirely cover, the array substrate. The conductive layer 1 is provided with a plurality of openings 14, each of the signal line-staggered region is disposed within a region corresponding to one of the plurality of openings 14.

A first insulating layer is disposed, and provides an insulation, between the conductive layer 1 and a plurality of common electrode lines 10, and a second insulating layer is disposed, and provides an insulation, between a plurality of common signal lines 20 and the plurality of common electrode lines 10.

In a non-display area, the conductive layer 1 is electrically connected with each of the plurality of common signal lines 20 through at least one second via 5 across the first insulating layer and the second insulating layer, and the conductive layer 1 is electrically connected with each of the plurality of common electrode lines 10 through at least one third via 6 across the first insulating layer.

In a display area, a portion of one common electrode line 10 is electrically connected with the conductive layer 1 through the at least one first via 4 across the first insulating layer.

Figure 4:
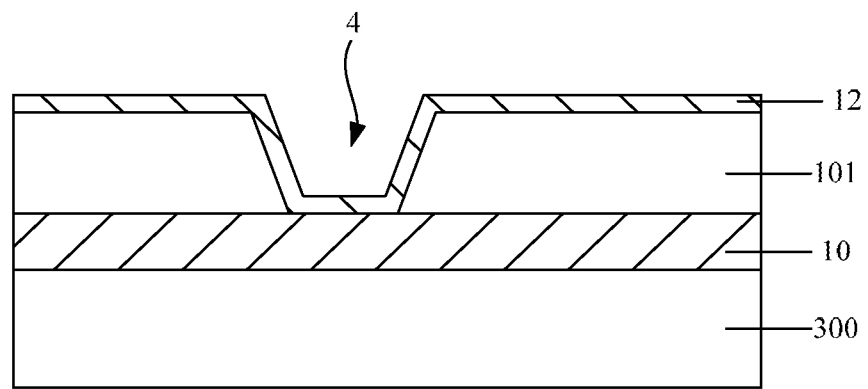
FIG. 4 is a cross-section view of the array substrate as shown in FIG. 3 along a direction of A-A.

The specific connections can be referenced to FIG. 4 and FIG. 5, and the detailed description is skipped herein. Other technical features can be referenced in the first embodiment.

In both the first embodiment and the second embodiment as described above, there is no conductive layer material disposed in a region corresponding to a signal line-staggered region, i.e., the conductive layer material is not disposed in a region corresponding to the signal line-staggered region or in the partitioning zone in the periphery of the signal line-staggered region.

As such, if an electrostatic breakdown occurs at the signal line-staggered region, the partitioning zone can be utilized for laser cutting and a subsequent repair, which can overcome the issue that short-circuiting sites cannot be repaired via laser cutting due to the easy welding between the conductive layer and the signal lines.

Figure 8:
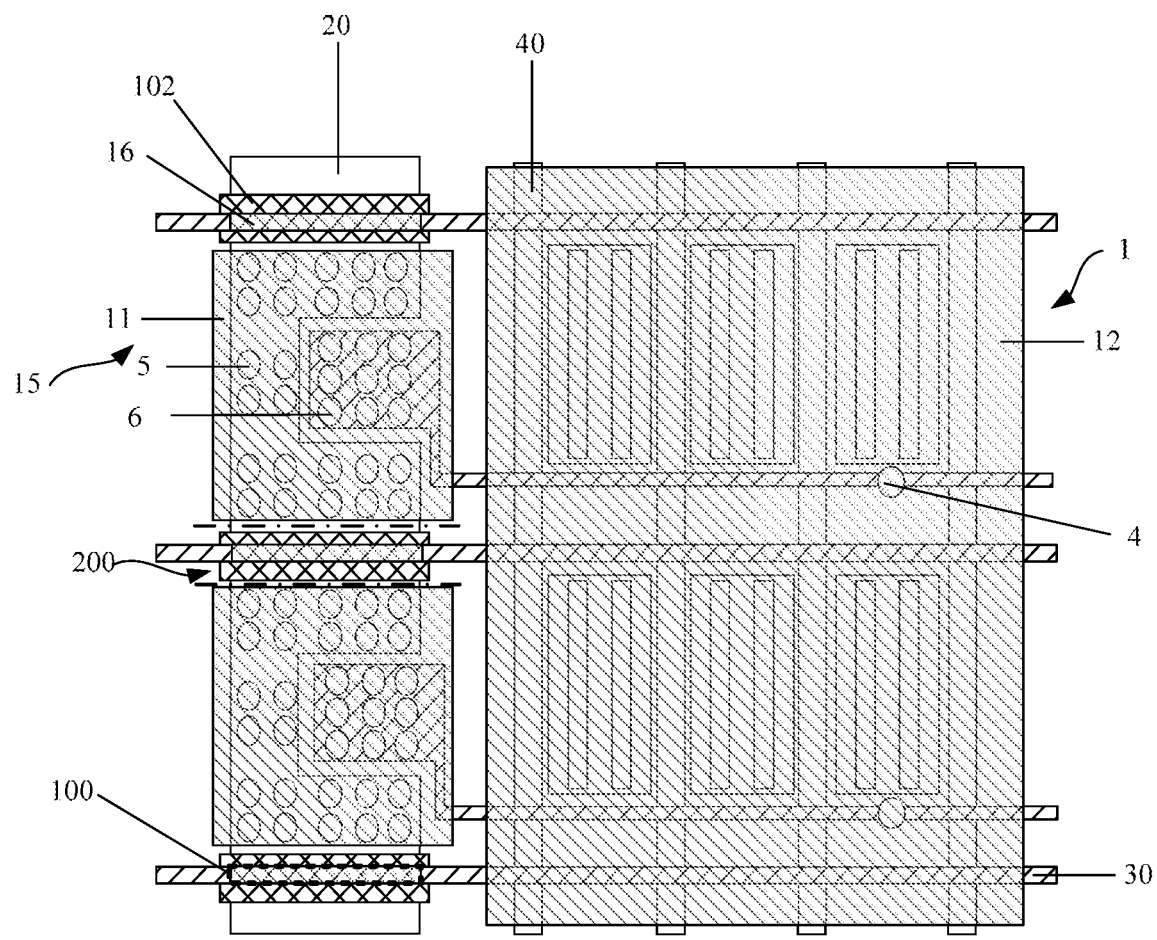
FIG. 8 is a schematic diagram of a conductive layer in an array substrate according to a third embodiment of the present disclosure.
Figure 9:
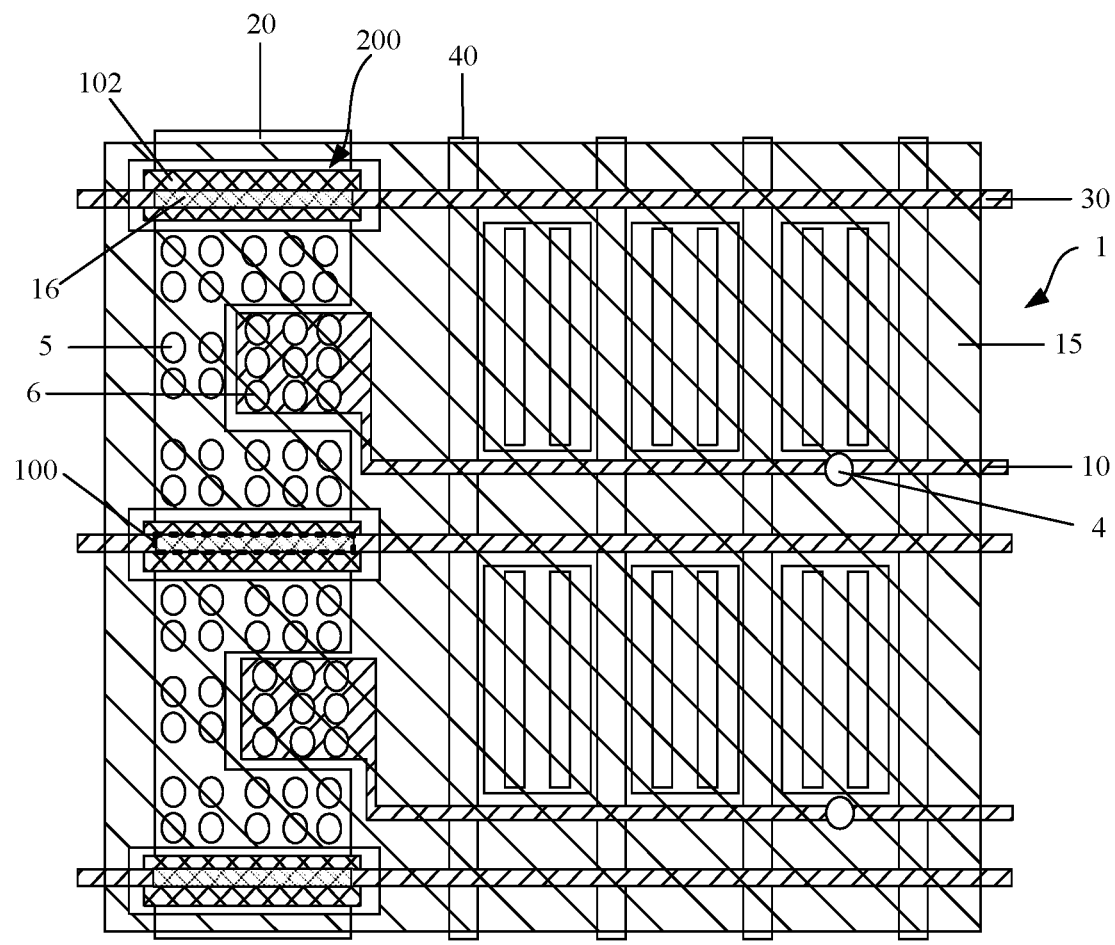
FIG. 9 is a schematic diagram of a conductive layer in an array substrate according to a fourth embodiment of the present disclosure.
Figure 10:
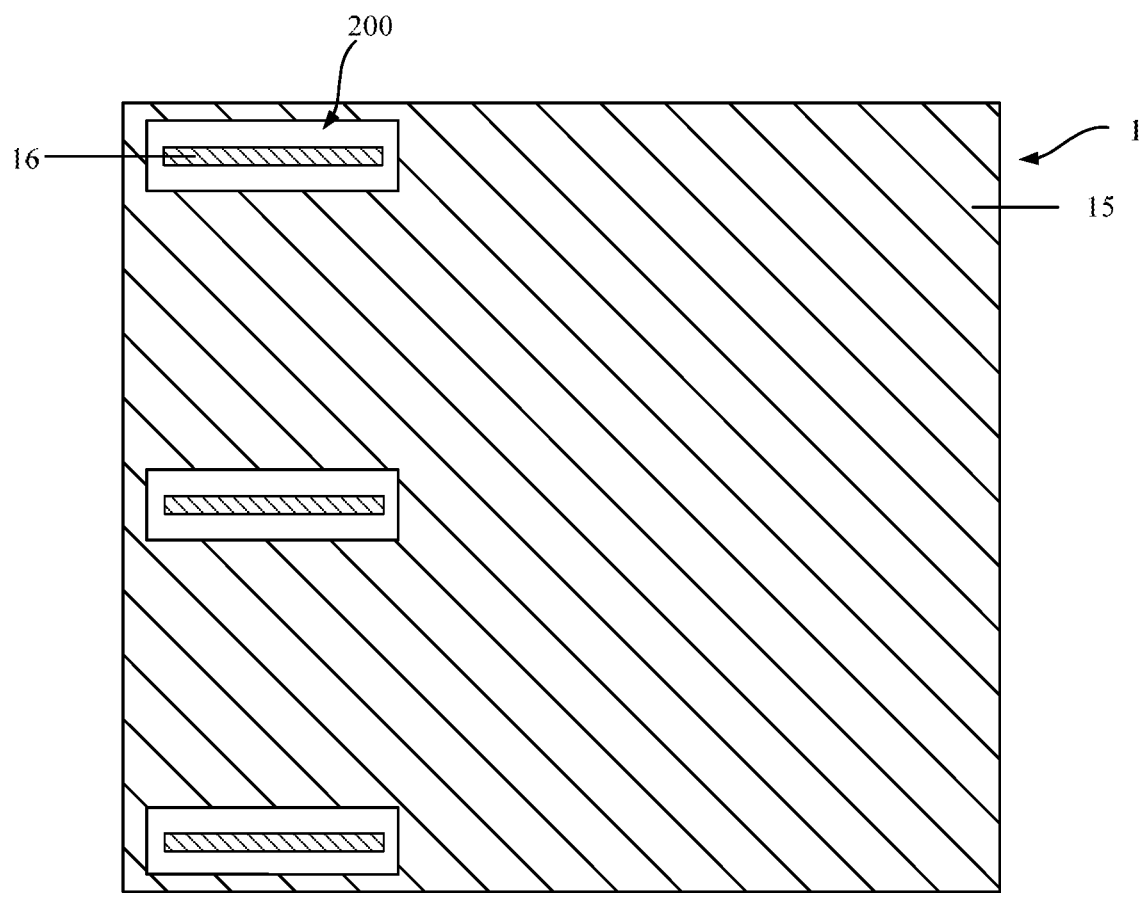
FIG. 10 is a schematic diagram of the conductive layer shown in FIG. 9.

FIGS. 8-10 illustrates a third embodiment of the array substrate, which is similar to the above two embodiments (the first embodiment and the second embodiment) by arranging no conductive layer in the partitioning zone in the periphery of each region corresponding to the signal line-staggered region (i.e., the region of the conductive layer that is essentially an orthographic projection of the signal-line staggered region on the conductive layer), and differs from the above two embodiments by still arranging the conductive layer material (i.e. the third portion of the conductive layer, to differentiate with the above mentioned first portion and second portion of the conductive layer) in region corresponding to each signal line-staggered region.

In the third embodiment of the array substrate, the conductive layer 1 comprises a fourth portion 15 and a plurality of third portions 16. The fourth portion 15 of the conductive layer 1 is configured to be outside, or in periphery of, the partitioning zone 200, and each third portion 16 of the conductive layer 1 is disposed in a region of the conductive layer corresponding to one signal line-staggered region.

In one specific embodiment as shown in FIG. 2 and FIG. 8, the fourth portion 15 is disposed in a periphery of the partitioning zone 200, and each third portion 16 is disposed in a region of the conductive layer that corresponds to the signal line-staggered region 100. As such, a region in the conductive layer encircled by an outer peripheral edge of the partitioning zone 200 and by an outer peripheral edge of the region corresponding to the signal line-staggered region 100 substantially forms one unfilled ring-shaped opening in the conductive layer, which is absent of conductive layer material.

The fourth portion 15 can comprise a plurality of fifth portions (equivalent to the plurality of first portions 11 in the first embodiment), all disposed within the first area. A distance, or a gap, is provided between every two neighboring fifth portions 11, and one signal line-staggered region 100 is arranged between every two neighboring fifth portions 11. At least one part of the partitioning zone 200 is arranged within a region between the signal line-staggered region 100 and a corresponding fifth portion 11 (i.e. one of the two fifth portions juxtaposing the signal line-staggered region).

As such, if an electrostatic breakdown occurs at a signal line-staggered region 100, the corresponding partitioning zone 200 (as shown in the dashed line in FIG. 8) can be utilized for laser cutting and a subsequent repair. Because no conductive layer is disposed at the partitioning zone 200, the issue that short-circuiting sites cannot be repaired via laser cutting due to the easy welding between the conductive layer and the signal lines can be effectively overcome, resulting in an improved repair rate and a reduced manufacturing cost.

Furthermore, the fourth portion 15 of the conductive layer 1 can further comprise a sixth portion (equivalent to the second portion 12 in the first embodiment), which is disposed in the second area and is separated from each fifth portion, and is configured to be electrically coupled with each of at least one common electrode line. Herein the first area and the second area do not overlap.

In another specific embodiment, as shown in FIG. 2, FIG. 9, and FIG. 10, the fourth portion 15 of the conductive layer 1 can be configured to be outside the partitioning zone 200, and each third portion 16 can be disposed at the signal line-staggered region 100.

As such, if an electrostatic breakdown occurs at the signal line-staggered region 100, the partitioning zone 200 (as shown in the dashed line in FIG. 9) can be utilized for laser cutting and a subsequent repair. Because no conductive layer is disposed over the partitioning zone 200, the issue that short-circuiting sites cannot be repaired via laser cutting due to the easy welding between the conductive layer and the signal lines can be effectively overcome, resulting in an improved repair rate and a reduced manufacturing cost.

The technical solutions as described here in the third embodiment can be applied to a thin-film transistor array substrate. The working principle in the third embodiment is substantially same as in the first embodiment and the second embodiment, and is thus skipped herein.

In all three above embodiments, a partitioning zone is arranged in a periphery of the signal line-staggered region, and is utilized for partitioning. The three embodiments represent three different configurations in which the conductive layer is configured in the region in an outer side of the partitioning zone.

These above configurations can be altered or adjusted. Any variations, alterations, or adjustments, so long as they have the partitioning zone arranged in the periphery of the signal line-staggered region, and they have the conductive layer disposed in a region in an outer side of the partitioning zone, are covered within the scope of the present disclosure.

In another aspect, the present disclosure further provides an electronic device, which comprises any one of the first embodiment, the second embodiment, and the third embodiment as described above.

If an electrostatic breakdown occurs at one signal line-staggered region, it can be repaired by a process involving laser cutting and a subsequent repair by means of the corresponding opening of the conductive layer in the array substrate, which results in an improved repair rate and a reduced manufacturing cost.

Herein the electronic device can be a liquid crystal display panel, a liquid crystal display apparatus, an OLED display panel, an OLED display apparatus, an e-paper, a cellular phone, a tablet computer, a television, a notebook computer, a digital camera, a GPS, or any product having a display function.

The electronic device can also be a circuit board or a non-display product having signal line-staggered region and conductive layers.

In yet another aspect, the present disclosure further provides a method for manufacturing the array substrate as described above. The method comprises the following steps:

Providing a substrate;

Forming a plurality of signal lines over the substrate, wherein the plurality of signal lines have at least two signal lines insulated and staggered from one another to thereby form at least one signal line-staggered region at each site of staggering; and Forming a conductive layer over the plurality of signal lines, wherein the conductive layer is configured such that a first zone formed by an orthographic projection of the at least one signal line-staggered region on the substrate has a gap with a second zone formed by an orthographic projection of the conductive layer on the substrate excluding the first zone.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
   a substrate;
   a plurality of signal lines, over the substrate and having at least two signal lines insulated and staggered from one another to thereby form at least one signal line-staggered region at each site of staggering; and
   a conductive layer;
   wherein:
      a first zone formed by an orthographic projection of the at least one signal line-staggered region on the substrate is configured to have a gap with a second zone formed by an orthographic projection of the conductive layer on the substrate excluding the first zone; and
      the array substrate is a thin-film transistor array substrate, and the plurality of signal lines comprise a common signal line and a plurality of gate lines, wherein the common signal line is staggered with each gate line at a signal line-staggered region.

2. The array substrate of claim 1, wherein the conductive layer is provided with at least one unfilled region, wherein:
   an orthographic projection of each of the at least one signal line-staggered region on the substrate is configured to be completely covered by an orthographic projection of one of the at least one unfilled region on the substrate.

3. The array substrate of claim 2, wherein the conductive layer comprises a plurality of first portions, disposed in a non-display area and separated from one another, wherein:
   the plurality of first portions are configured such that every two neighboring first portions are separated from one another by one of the at least one unfilled region; and
   an orthographic projection of the one of the at least one unfilled region on the substrate is configured to cover an orthographic projection of one of the at least one signal line-staggered region on the substrate.

4. The array substrate of claim 3, wherein the conductive layer further comprises a second portion, disposed in a display area, wherein:
   the second portion is separated from each of the plurality of first portions and is electrically coupled with a common electrode line.

5. The array substrate of claim 2, wherein:
   one or more of the at least one unfilled region is in a non-display area; and
   each of the one or more of the at least one unfilled region is surrounded by the conductive layer and configured such that an orthographic projection thereof on the substrate is configured to cover an orthographic projection of one of the at least one signal line-staggered region on the substrate.

6. The array substrate of claim 2, wherein the conductive layer further comprises at least one third portion, wherein:
   each of the at least one third portion is disposed within, and isolated from other part of the conductive layer by, one of the at least one unfilled region.

7. The array substrate of claim 6, wherein an orthographic projection of each of the at least one third portion on the substrate is configured to be overlapped with an orthographic projection of one of the at least one signal line-staggered region on the substrate.

8. The array substrate of claim 1, further comprising a plurality of common electrode lines, wherein the conductive layer is configured to electrically couple the common signal line with each of the plurality of common electrode lines.

9. The array substrate of claim 8, further comprising a first insulating layer, disposed between the plurality of common electrode lines and the conductive layer, wherein the conductive layer is electrically coupled with each of the plurality of common electrode lines by means of a plurality of vias across the first insulating layer.

10. The array substrate of claim 8, wherein the plurality of common electrode lines are disposed in a same layer as, and are each in parallel with, the plurality of gate lines.

11. The array substrate of claim 8, further comprising a plurality of data lines, disposed in a same layer as, and are each in parallel with, the common signal line.

12. The array substrate of claim 9, wherein the plurality of vias comprise at least one first via and at least one third via, wherein the conductive layer is electrically coupled with the each common electrode line by means of the at least one first via in a display area, and by means of the at least one third via in a non-display area.

13. The array substrate of claim 9, further comprising a second insulating layer, disposed between the common signal line and the plurality of common electrode lines, wherein the conductive layer is electrically coupled with the common signal line through at least one second via across the first insulating layer and the second insulating layer.

14. The array substrate of claim 1, wherein the conductive layer comprises a transparent conductive material.

15. The array substrate of claim 14, wherein the transparent conductive material comprises at least one of HIZO, ZnO, TiO2, CdSnO, MgZnO, IGO, IZO, ITO, and IGZO.

16. An electronic device, comprising an array substrate according to claim 1.

17. The electronic device according to claim 16, comprising a display panel, wherein the array substrate is in the display panel.

18. A method for manufacturing the array substrate of claim 1, the method comprising:
providing the substrate;
forming the plurality of signal lines over the substrate, wherein the plurality of signal lines have at least two signal lines insulated and staggered from one another to thereby form at least one signal line-staggered region at each site of staggering; and
forming a conductive layer over the plurality of signal lines, wherein the conductive layer is configured such that a first zone formed by an orthographic projection of the at least one signal line-staggered region on the substrate has a gap with a second zone formed by an orthographic projection of the conductive layer on the substrate excluding the first zone.

* * * * *